US012765312B2

(12) United States Patent
Kang

(10) Patent No.: US 12,765,312 B2
(45) Date of Patent: Oct. 13, 2026

(54) WAFER BOW METROLOGY SYSTEM

(71) Applicant: Tokyo Electron Limited, Tokyo (JP)

(72) Inventor: Hoyoung Kang, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 158 days.

(21) Appl. No.: 18/621,827

(22) Filed: Mar. 29, 2024

(65) Prior Publication Data

US 2025/0132180 A1 Apr. 24, 2025

Related U.S. Application Data

(60) Provisional application No. 63/592,914, filed on Oct. 24, 2023.

(51) Int. Cl.
*H01L 21/67* (2006.01)
*G01B 11/25* (2006.01)
*H10P 72/00* (2026.01)

(52) U.S. Cl.
CPC ........ *H10P 72/0616* (2026.01); *G01B 11/254* (2013.01)

(58) Field of Classification Search
CPC . H01L 21/67288; H01L 21/027; H01L 22/20; H01L 21/31144; H01L 2924/3511; G01B 11/254; G01B 11/255; G01B 11/25; G01B 11/2504; G01B 21/045; G01B 2210/48; G03F 7/70783; G05B 19/4099; H10F 39/8063
See application file for complete search history.

(56) References Cited

U.S. PATENT DOCUMENTS 3,601,018 A * 8/1971 Lange .................... H01J 9/2272 396/546
4,291,990 A * 9/1981 Takasu .................... G01N 21/88 356/613

(Continued)

FOREIGN PATENT DOCUMENTS

CN 116045827 A 5/2023
JP 7-167626 A 7/1995

(Continued)

OTHER PUBLICATIONS

International Search Report and Written Opinion issued Nov. 27, 2024 in PCT/US2024/044424, 10 pgs.

*Primary Examiner* — Mohamed K Amara
(74) *Attorney, Agent, or Firm* — Oblon, McClelland, Maier & Neustadt, L.L.P.

(57) ABSTRACT

Aspects of the present disclosure provide a metrology system for measuring wafer bow of a wafer. For example, the metrology system can include a wafer support configured to position a wafer for wafer bow measurement, a first light source configured to illuminate a first side of the wafer during the wafer bow measurement, and a first pinhole mask disposed between the first light source and the wafer support. The first pinhole mask can include a plurality of first pinholes that are arranged to pass first light from the first light source and project onto the first side of the wafer a plurality of first dots that correspond to the first pinholes in the first pinhole mask. The metrology system can also include a first camera arranged to capture an image of the first dots from the first side of the wafer during the wafer bow measurement.

20 Claims, 5 Drawing Sheets

(56) References Cited

U.S. PATENT DOCUMENTS 5,912,738 A * 6/1999 Chason ................ G01B 11/255 356/601
6,133,986 A * 10/2000 Johnson .............. G03F 7/70091 355/77
7,420,608 B2 * 9/2008 Yamasaki ............... H10F 39/12 348/340
7,440,094 B2 10/2008 Yoo
12,354,973 B2 * 7/2025 Subrahmanyan ... G03F 7/70783
2002/0014577 A1 * 2/2002 Ulrich ..................... H01L 21/00 257/E21.001
2002/0129723 A1 * 9/2002 Beier ....................... B41J 2/451 101/463.1
2004/0042648 A1 * 3/2004 Yoshidda .................. G06T 7/12 382/151
2005/0036216 A1 * 2/2005 Lee ......................... G02B 5/005 348/E5.139
2007/0146685 A1 * 6/2007 Yoo .................. G01N 21/95607 356/601
2008/0108206 A1 * 5/2008 Shimomura ........... H10D 86/60 257/E21.104
2008/0186512 A1 * 8/2008 Kee ......................... G01B 11/25 356/615
2008/0278570 A1 * 11/2008 Gharib ............... G01B 11/2509 348/E13.005
2008/0286885 A1 * 11/2008 Izikson ............... G03F 7/70508 257/E21.53
2010/0098323 A1 * 4/2010 Agrawal ................. G06T 7/557 382/154
2011/0205514 A1 * 8/2011 Kita .................... G03F 7/70941 356/124.5
2012/0208301 A1 * 8/2012 Izikson ............... G03F 7/70625 257/E21.525
2014/0253907 A1 * 9/2014 Ignatovich ........... G01M 11/025 356/73
2017/0046854 A1 * 2/2017 Sugihara ............ G01B 11/2513
2017/0054965 A1 * 2/2017 Raab ...................... G01B 11/25
2018/0092516 A1 * 4/2018 Imade ................ A61B 1/00186
2021/0257181 A1 * 8/2021 Van De Kerkhof .... F16L 11/12
2025/0029847 A1 * 1/2025 Ip ...................... H01L 21/67288

FOREIGN PATENT DOCUMENTS

JP 2007-57502 A 3/2007
KR 10-2004-0008740 A 1/2004
WO WO-2024141216 A1 * 7/2024 ......... G01B 11/2441

* cited by examiner

WAFER BOW METROLOGY SYSTEM

CROSS-REFERENCE TO RELATED APPLICATIONS

This present application claims the benefit of U.S. Provisional Application No. 63/592,914, "Wafer Bow Metrology System" filed on Oct. 24, 2023, which is incorporated herein by reference in its entirety.

FIELD OF THE INVENTION

The present disclosure relates to semiconductor wafer processing, and, in particular, to a system for measuring the bow of semiconductor wafers.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Semiconductor wafers undergo a large number of processing steps to form semiconductor devices. During these processing steps, one important determinant of the success and yield of many processing steps is the extent to which the wafer is bowed out of flat, i.e., out-of-plane, prior to, during and after a processing step.

For example, in wafer-to-wafer bonding, which is a packaging technology used in production of microelectronics, microelectromechanical systems (MEMS), nanoelectromechanical systems (NEMS), optoelectronics, etc., two wafers are bonded wherein an exposed surface of one wafer is bonded to the exposed surface of another wafer, the two wafers forming a semiconductor device or part of a semiconductor device. Multiple materials may be present at the bonding interface of a wafer, such as dielectric materials and metal interconnects, where the latter forms an electrical contact with matching metal interconnects of the second wafer to be bonded. Such bonding processes where multiple materials are present at the bonding interface are known as hybrid bonding.

The quality of the hybrid bonding of two wafers depends on a number of factors, broadly categorized into wafer characteristics and process conditions. Among the former category, wafer flatness, wafer smoothness, wafer cleanliness, wafer materials used, and so on, all affect the ultimate outcome of the bonding process.

Because of the increasing use of hybrid bonding in forming heterogeneous devices from multiple wafers and/or chips, ensuring the wafer bow is within specifications prior to hybrid bonding can significantly decrease the number of bonding defects and increase device yield. Multiple types of metrology systems are in current use for measuring wafer bow, such as optical interferometers, various types of capacitive sensors, etc. In practice, the out-of-plane wafer bow needs to be mapped across the entire wafer, necessitating the measurement of the out-of-plane displacement at a large number of points across the wafer surface. Most metrology systems suffer from a significant drop of throughput, i.e., the number of wafers that a metrology system can map in a unit amount of time (e.g., an hour), when the number of points measured per wafer is large. This, in turn, leads to an overall decrease of throughput of the bonding process itself.

While in the previous discussion focus was on hybrid bonding, many other semiconductor manufacturing processes demand wafer bow to be within specified limits, such as in various lithography, patterning, and thin film processes, etc. Some of these processes utilize active means of controlling wafer bow, the use of which active means demands measurement of incoming wafer bow maps, as well as measurement of post-active control wafer bow maps.

Therefore, there exists a need for wafer bow metrology systems that can rapidly map out-of-plane wafer bow across an entire wafer in a short amount of time. Such systems would be particularly suited for including in semiconductor processing tools, for in-line wafer inspection between processing steps. Furthermore, it would be advantageous if the in-line metrology system would have a lower cost than typical wafer bow metrology systems. A wafer bow metrology system with increased throughput and low cost can also advantageously be used in standalone metrology systems.

SUMMARY

Aspects of the present disclosure provide a metrology system for measuring wafer bow of a wafer. For example, the metrology system can include a wafer support configured to position a wafer for wafer bow measurement, a first light source configured to illuminate a first side of the wafer during the wafer bow measurement, and a first pinhole mask disposed between the first light source and the wafer support. The first pinhole mask can include a plurality of first pinholes that are arranged to pass first light from the first light source and project onto the first side of the wafer a plurality of first dots that correspond to the first pinholes in the first pinhole mask. The metrology system can also include a first camera arranged to capture an image of the first dots from the first side of the wafer during the wafer bow measurement.

In an embodiment, the metrology system can further include one or more modules configured to process the wafer. In another embodiment, the metrology system can further include a measurement control system coupled to the first light source and the first camera. The measurement control system can be configured to measure wafer bow of a target wafer by comparing an image of target dots captured for the target wafer with an image of reference dots captured for a reference wafer. In some embodiment, the first pinholes in the first pinhole mask can be arranged according to a rectilinear pattern. In various embodiments, the first pinholes can be spaced equally in a first direction of the rectilinear pattern and spaced equally in a second direction of the rectilinear pattern. The second direction can be orthogonal to the first direction.

In an embodiment, the first pinhole mask can include a first opening for passing first reflected light from the first side of the wafer to the first camera. For example, the first opening can be centrally located relative to the wafer and the first dots in the first pinhole mask.

In an embodiment, the wafer support can orient the wafer in a horizontal position relative to a direction of gravity. In another embodiment, the wafer support can orient the wafer in a vertical position relative to a direction of gravity. In some embodiments, the wafer can be oriented at an oblique inclination relative to vertical. In various embodiments, the oblique inclination can be within 15 degrees off vertical orientation.

In an embodiment, the metrology system can further include a second light source configured to illuminate a second side of the wafer during the wafer bow measurement. The second side can be opposite the first side of the wafer. The metrology system can further include a second pinhole mask disposed between the second light source and the wafer support. The second pinhole mask can include a plurality of second pinholes that are arranged to pass second light from the second light source and project onto the second side of the wafer a plurality of second dots that correspond to the second pinholes in the second pinhole mask. The metrology system can further include a second camera configured to capture an image of the second dots from the second side of the wafer during the wafer bow measurement.

In an embodiment, the metrology system can further include a wafer flipper configured to receive the wafer from the wafer support, flip the wafer, and return the wafer to the wafer support for the wafer bow measurement on the second side of the wafer. In another embodiment, the wafer support can be configured to flip the wafer and reposition the wafer for the wafer bow measurement on the second side of the wafer. In some embodiments, the metrology system can be configured to perform the wafer bow measurement in less than 10 seconds. In various embodiments, the metrology system can be configured to compute the wafer bow of the wafer from the image of the first dots captured by the first camera in less than 30 seconds.

In an embodiment, the wafer support can support the wafer at a center of the wafer. In another embodiment, the wafer support can support the wafer at an edge of the wafer. In some embodiments, the first light source can be further configured to illuminate the second side of the wafer during the wafer bow measurement, the first pinholes of the first pinhole mask can be further arranged to pass second light from the first light source and project onto the second side of the wafer a plurality of second dots that corresponds to the first pinholes, the first camera can be further arranged to capture an image of the second dots from the second side of the wafer, and the wafer bow measurement can be performed on the first side and the second side of the wafer to correct for effects of gravity.

In an embodiment, the metrology system can further include an alignment system configured to align the wafer on the wafer support for the wafer bow measurement.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION

Figure 1:
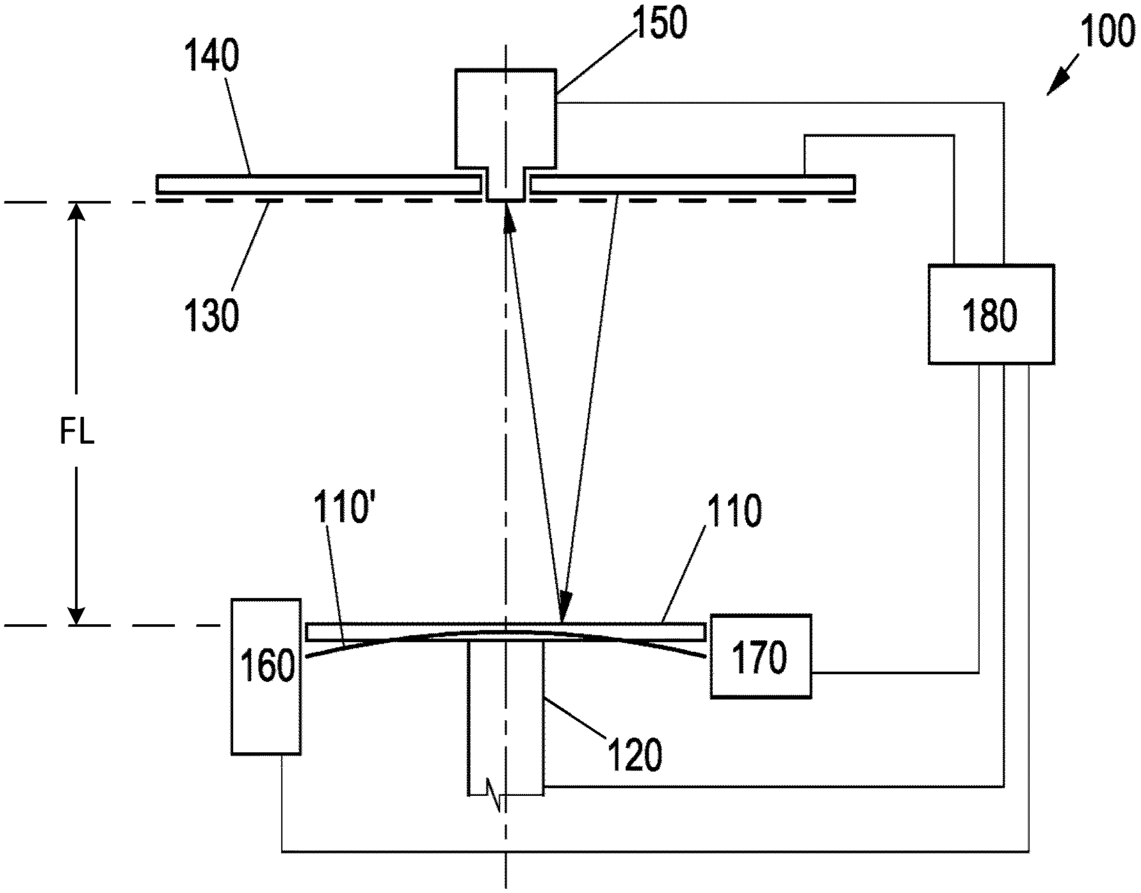
FIG. 1 shows an exemplary metrology system for measuring wafer bow of a wafer in accordance with an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as “top,” “bottom,” “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

The present disclosure relates to a wafer bow measurement system for achieving high throughput, for example, having the capability to map wafer bow across the incoming wafer in as little as 30 seconds, or even less.

FIG. 1 shows an exemplary (wafer bow) metrology system 100 for measuring wafer bow of a wafer 110 during bow wafer measurement in accordance with an embodiment of the present disclosure. The metrology system 100 may be a part of a standalone wafer measurement kiosk. The wafer 110 can be held on a wafer support 120, in a horizontal orientation, such that gravity exerts an out-of-plane pull on the wafer 110 during measurement of wafer bow. In an embodiment, the wafer 110 is without any wafer bow and can act as a reference wafer 110. In another embodiment, the wafer 110 is with arbitrary and unknown wafer bow and is a measured (or target) wafer 110 whose bow is to be measured. An alignment system 160 may be included and is used to align the wafer 110 on the wafer support 120. The wafer support 120 can be of a small diameter, for example, about 30 mm, or less, thus a large part of the wafer 110 is affected by gravity, which may cause the wafer 110 to sag downwards (indicated by a sagged wafer line 110' in FIG. 1), in addition to the intrinsic out-of-plane bow of the wafer 110 itself.

In an embodiment, the metrology system 100 can utilize a light source 140, e.g., a planar light source, for illuminating the wafer 110 through a pinhole mask 130. The planar light source 140 may include an array of light units, e.g., LEDs or other suitable discrete point sources or linear light sources, equipped with a diffuser or other optical components to even out the light intensity distribution across the array of discrete light units.

Figure 2:
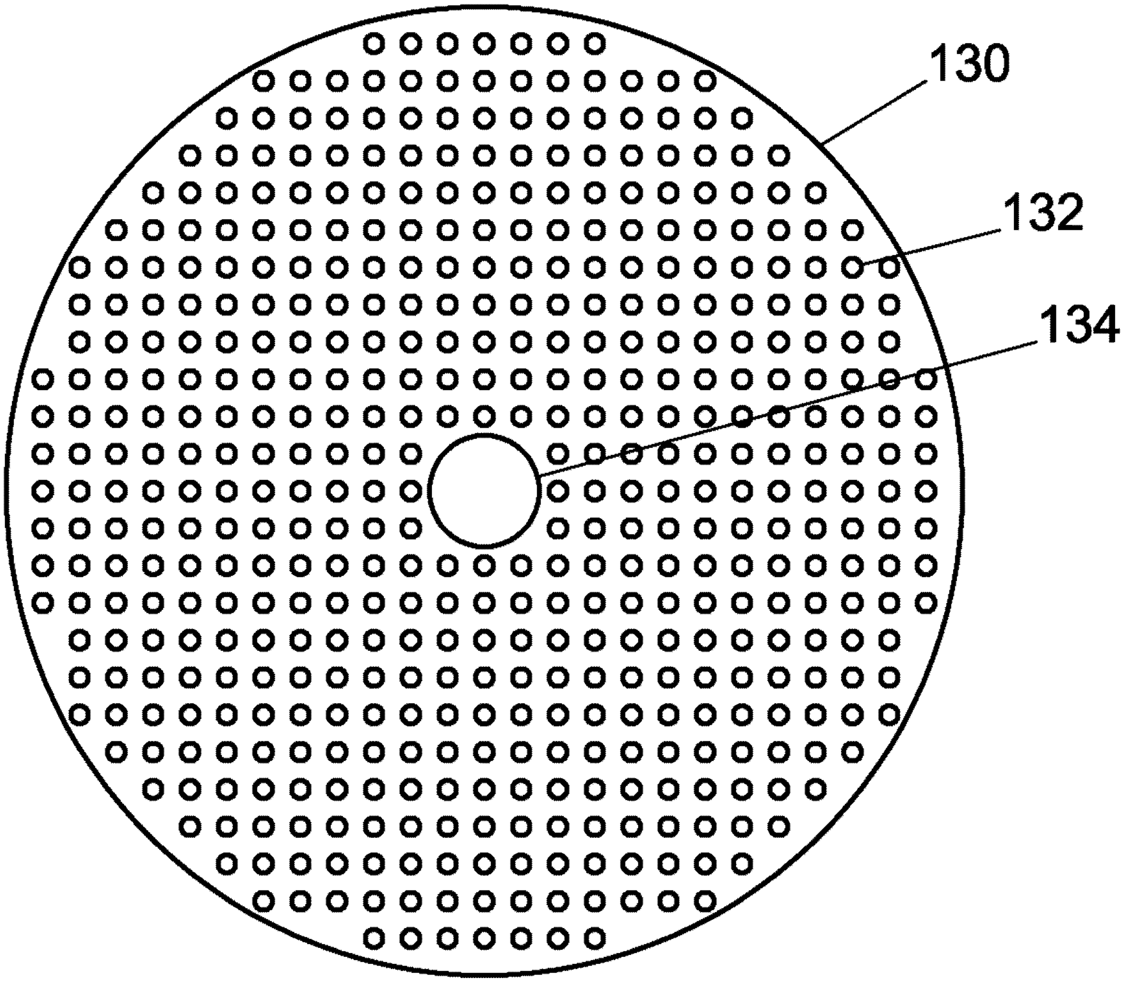
FIG. 2 shows an exemplary pinhole mask used in the metrology system of FIG. 1 in accordance with an embodiment of the present disclosure.

An opening 134, as shown in FIG. 2, can be formed in the center of the light source 140 and the pinhole mask 130 to pass reflected light from the wafer 110 to a camera 150 that is mounted on top of the light source 140 to allow the camera 150 to acquire images of the entire upper surface of the wafer 110. In an embodiment, a standard CMOS or CCD camera with a resolution of, for example, 4,500×4,500 pixels can be used as the camera 150. As shown in FIG. 2, the pinhole mask 130 can include an array of pinholes 132 that can be drilled in a rectilinear or other suitable array (e.g., polar, etc.). In an embodiment, a rectilinear array of pinholes 132 may have an equal pitch in both directions of about 0.5 to 4 mm. In other embodiments, a non-rectilinear array of pinholes 132 may be used, with pitch adjusted across the pinhole mask 130 to maintain a substantially uniform density of the pinhole pattern. The diameter of at least one of the pinholes 132 may be from 50 mm to 1 mm. In some embodiments, one or more modules, e.g., etching module, development module, and so on, that are configured for processing a wafer, e.g., the wafer 110, may be integrated with the metrology system 100 on a common platform.

During operation of the metrology system 100, the light source 140 can project a pattern of dots onto the upper surface of the wafer 110 through the array of pinholes 132 of the pinhole mask 130. The sizes of the light source 140 and the pinhole mask 130 can be selected to ensure full illumination of the wafer 110 with the pattern of projected dots. In an embodiment, the diameter of the pinhole mask 130 may be about 600 mm (approximately twice the diameter of the wafer 110), and the distance FL between the pinhole mask 130 and the wafer 110 may be set around 400 mm.

Figure 3:
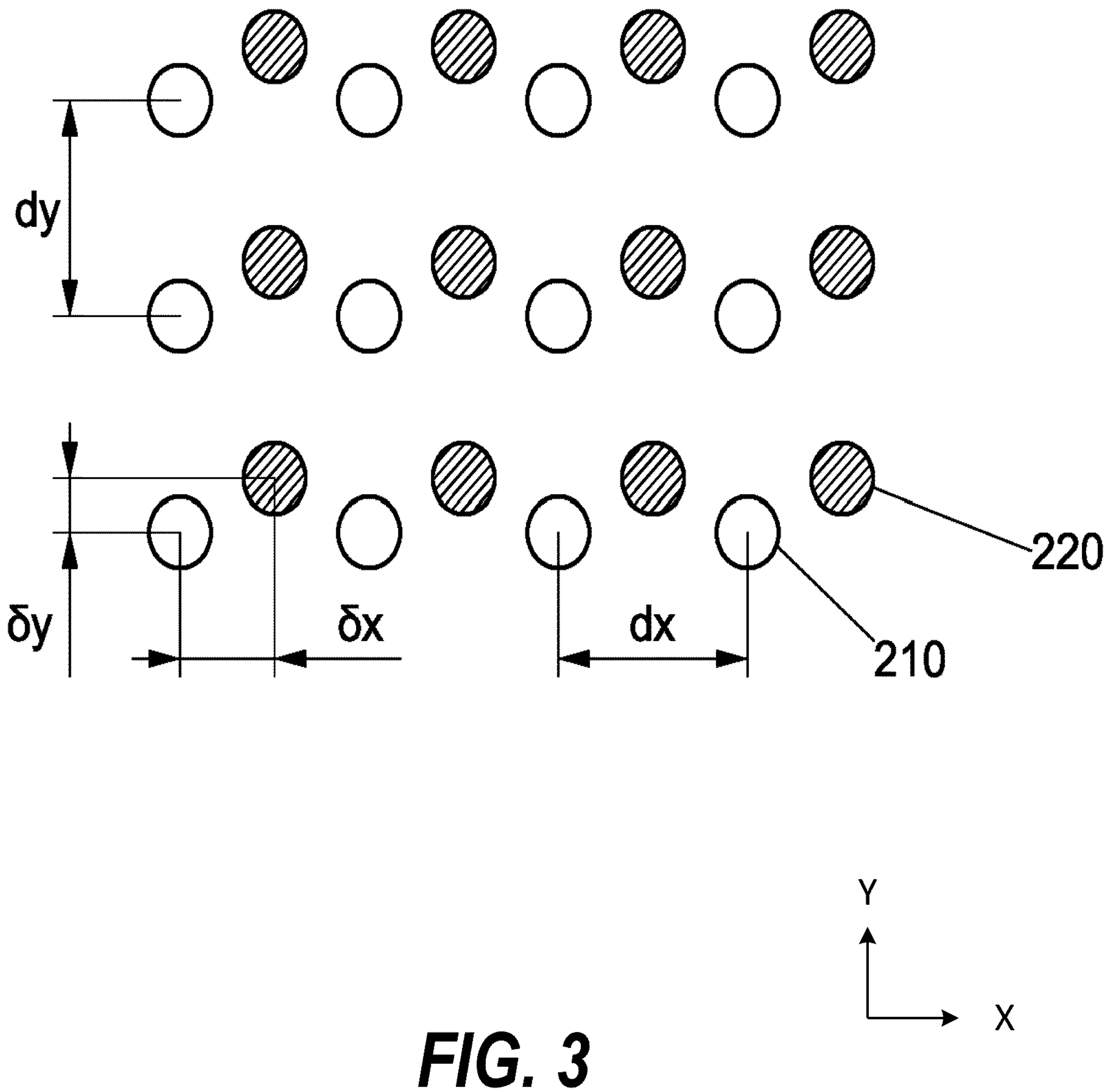
FIG. 3 shows a schematic diagram of an exemplary array of reference dots and target dots that are captured in images of the wafer during operation of the metrology system of FIG. 1 in accordance with an embodiment of the present disclosure.

FIG. 3 shows a schematic diagram of an exemplary array of reference dots 210 that are captured in an image of the wafer 110 (e.g., the reference wafer 110), acquired by the camera 150 during operation of the metrology system 100, when the light source 140 is projecting a pattern of dots (corresponding to the array of pinholes 132) onto the upper surface of the reference wafer 110 through the array of pinholes 132 of the pinhole mask 130. The spacings of the reference dots 210 in two directions of the image of the reference wafer 110, X and Y, are dx and dy, respectively. For any other wafer (e.g., the measured wafer 110) with arbitrary and unknown wafer bow, both intrinsic and added bow due to gravity, a projected array of target dots 220 of the bowed measured wafer 110 will generally be displaced from the array of reference dots 210 in the image of the reference wafer 110.

Assuming the wafer out-of-plane displacement z is equal 0 at the center of the wafer 110 (e.g., the measured wafer 110, where it rests on the wafer support 120), the slope of the wafer out-of-plane displacement z in direction X can be determined as $dz/dx=-(dx-xdz/FL)/FL$, where dx is the displacement of the array of reference dots 210 (i.e., from the array of reference dots 210 to the array of target dots 220) in X direction. Similarly, the slope of the out-of-plane displacement z in Y direction can be determined $dz/dy=-(dy-ydz/FL)/FL$, where dy is the displacement of the array of reference dots 210 (i.e., from the array of reference dots 210 to the array of target dots 220) in Y direction. These two equations for slopes of the out-of-plane displacement z in X and Y directions can be readily and efficiently numerically integrated to yield a distribution, i.e., map of out-of-plane displacement dz (x,y), across the wafer 110 (e.g., the measured wafer). For the small portion of the wafer 110 (e.g., a central portion of the wafer 110 that corresponds to the opening 134 of the pinhole mask 130) that is resting on the wafer support 120 and not illuminated with the pattern of dots (corresponding to the array of pinholes 132) due to the opening 134, interpolation may be used to determine the wafer bow.

To be able to correct for effects of gravity, after one full wafer bow measurement is made with a first wafer side of the wafer 110 facing upwards, a second measurement can be made of the wafer 110 which has been flipped upside down and placed back on the wafer support 120, with a second wafer side of the wafer 110 facing upwards. The average of the displacements of the arrays of reference dots 210 (i.e., from the array of reference dots 210 to the array of measured dots 220) in the two orientations are used in the calculation of wafer bow, thereby eliminating the effect of gravity and gravitational sag on the bow measurement. To facilitate the flipping of the wafer 110, the wafer support 120 may include means for flipping the wafer 110, or a separate wafer flipper 170 may be included in the metrology system 100.

The operation of the metrology system 100 is controlled and all measurement data acquired using a measurement control system 180, which is coupled to the wafer support 120, the light source 140, the camera 150, the alignment system 160 and the wafer flipper 170. The wafer support 120 may optionally be equipped with one or more XY, r theta, or similar stages (not shown) for moving the wafer 110, if necessary for wafer loading and during measurement.

When acquiring images of the wafer 110 with the camera 150, the location of each dot of the array of measured dots 220 can be determined using conventional image processing methods such as finding the dot centroid in the acquired image. The use of accurate location of dots in images has been shown to improve accuracy of measured wafer bow. A further correction that may be applied to acquired images can include correction for lens distortions, particularly barrel distortion that is inherent to every lens. To make such a correction, images may be acquired of a reference plate with an engraved pattern, which images can be used to correct pixel locations in acquired images to correct for lens distortion. Optionally, the pinhole mask 130 itself may be detached from its usual location and placed on the wafer support 120 to be used for creation of a lens distortion correction image. In the latter case, the accurate rectilinear pattern of pinholes 132 can act as a set of straight lines to be "straightened" in acquired images distorted by the lens of the camera 150. Yet another correction that may be applied advantageously to acquired images is brightness correction, to correct for nonuniform brightness of the image that can be a result of (a) nonuniform brightness of the light source 140, (b) nonuniform illumination of the wafer 110 due to variation of incidence angle of light rays from the pinhole mask

130, and (c) brightness variation due to curvature of the wafer 110 (associated with wafer bow) causing preferential reflection and scattering of light towards and away from the camera 150. Brightness corrections improve measured wafer bow data by allowing more accurate location of dots in acquired images, because a reduced variation of image brightness causes a reduction of variation of apparent dot sizes in acquired images, i.e., swelling and shrinking of dots in different regions of the image, thereby allowing more accurate dot location.

Figure 4:
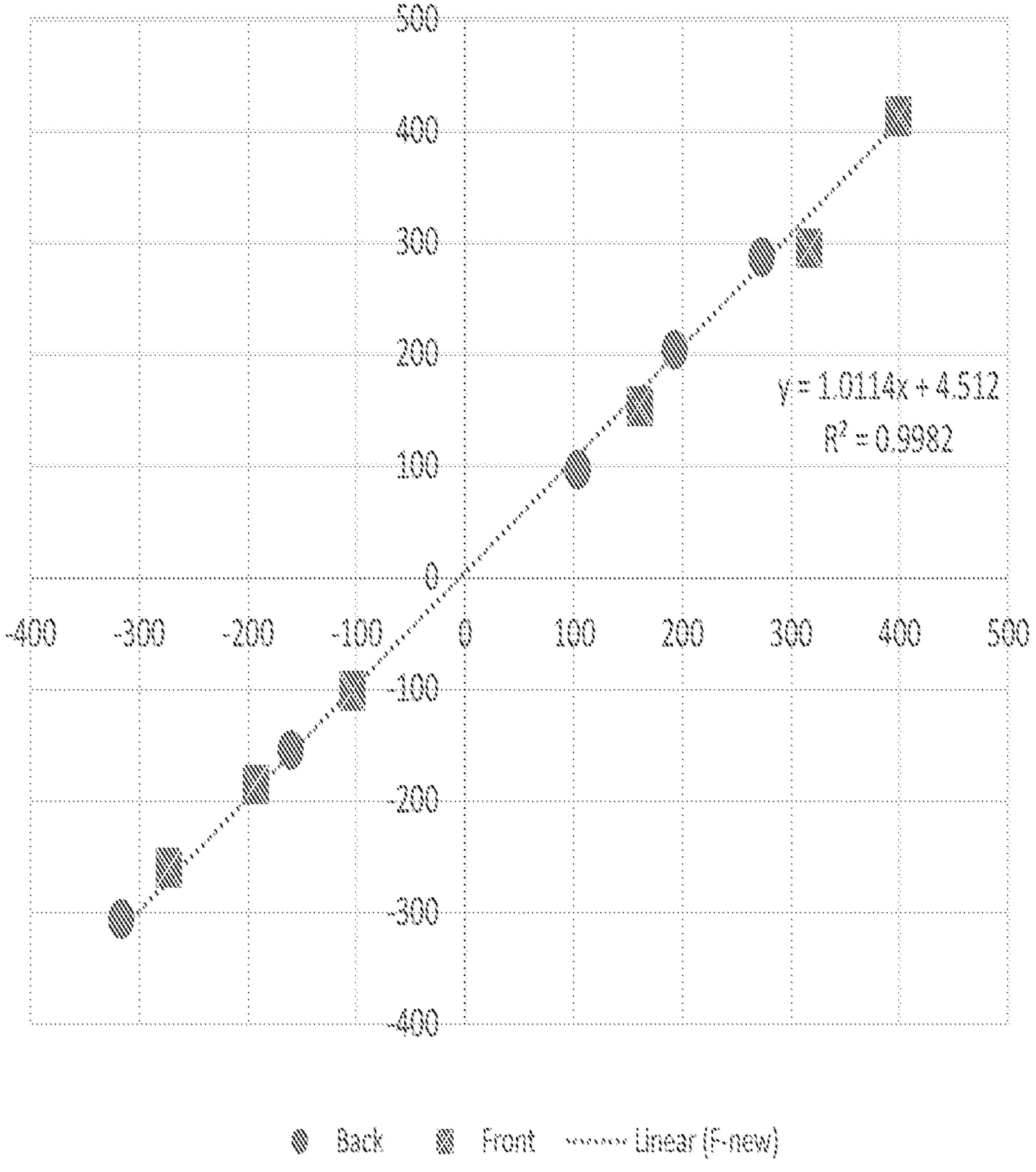
FIG. 4 shows a comparison diagram of the wafer bow measured using the metrology system of FIG. 1 and a standard standalone optical interferometric wafer bow metrology system.

It has been found that the metrology system 100 is capable of taking needed images of the wafer 110 in less than 10 seconds (e.g., about 5 seconds), and that calculation of wafer bow from acquired images is possible in another 25 seconds, for a total of 30 seconds needed for each wafer bow measurement. This reduction of time of wafer bow measurement is significant compared to conventional wafer bow metrology systems. Furthermore, as can be seen in FIG. 4, the measured wafer bow compares well to wafer bow measured using a standard standalone optical interferometric wafer bow metrology system. Yet, it is done in the fraction of the needed time, and using the metrology system 100 costs a fraction of the cost of an optical interferometric system.

In the example embodiment shown in FIG. 1, the wafer support 120 is of a small diameter such that a large part of the wafer 110 is not supported by the wafer support 120 and is affected by gravity, which may cause the wafer 110 to sag downwards, in addition to the intrinsic out-of-plane bow of the wafer itself. In some embodiments, the wafer support 120 may be of a diameter that is large enough to support the entire wafer 110. Therefore, the gravity effect may be eliminated and it is not needed to flip the wafer 110.

Figure 5:
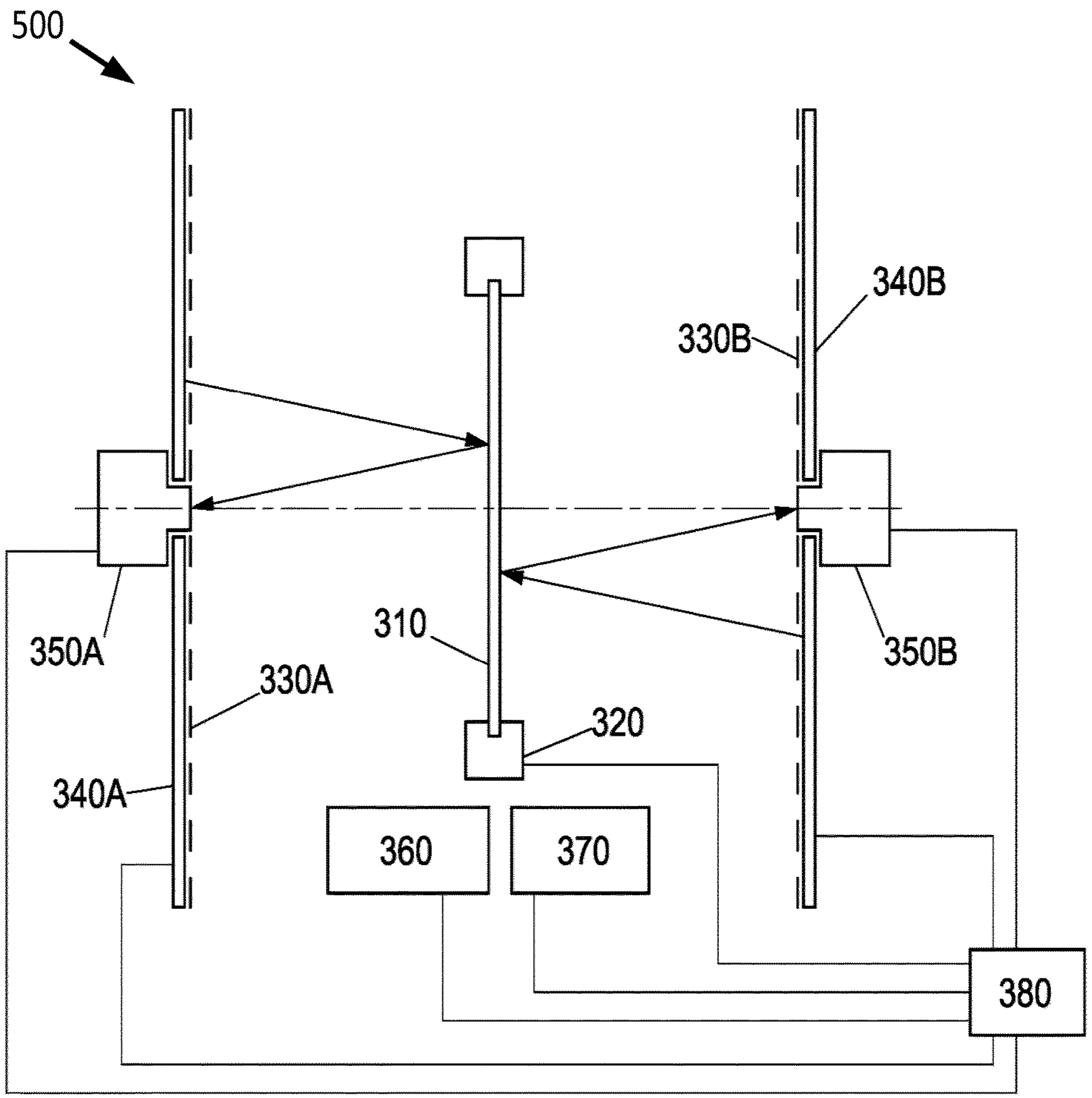
FIG. 5 shows another exemplary metrology system for measuring wafer bow of a wafer in accordance with an embodiment of the present disclosure.

FIG. 5 shows an alternate embodiment of a metrology system 500 in which a wafer 310 is oriented vertically, or alternatively substantially vertically, i.e., to within 15 degrees (e.g., 10 degrees) off vertical orientation (not shown). Vertical or substantially vertical orientation of the wafer 310 reduces or eliminates the effect of gravity on wafer bow measurements. The main advantage of the metrology system 500 over the metrology system 100 is in the elimination of the need to flip the wafer 310 to eliminate the gravity effect, which allows an increase of throughput due to eliminated second measurement. A wafer support 320 would take the form of, for example, clips or holders for holding the edge of the wafer 310. An alignment system 360 may still be used to align the wafer 310 on the wafer support 320. The metrology system 300 may be configured for single- or double-sided wafer bow measurement by including a single set of pinhole mask 330A, light source 340A, and camera 350A, or adding a second set of pinhole mask 330B, light source 340B, and camera 350B, respectively. The use of the second set of pinhole mask 330B, light source 340B, and camera 350B allows the wafer bow to be measured on both sides of the wafer 310 simultaneously, without the need to flip the wafer 310, which not only results in improvement of metrology system throughput, but potentially also accuracy due to elimination of repositioning of the wafer 310. An optional wafer flipper 370 may be included with a single-sided metrology system 300, for flipping the wafer 310 after a wafer bow measurement is made of one side, to measure wafer bow on the other side of the wafer 310. In all other aspects, the operation of the metrology system 300 is the same as the operation of the metrology system 100, and all image and data processing steps are identical. The metrology system 300 can be controlled by a metrology control system 380, in communication with the wafer support 320, the alignment system 360, the optional wafer flipper 370, the light source 340A, the camera 350A, and optionally the light source 340B and the camera 350B.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the present disclosure. The substrate may include any material portion or structure of a device, particularly a semiconductor or other electronics device, and may, for example, be a base substrate structure, such as a semiconductor wafer, reticle, or a dielectric layer on or overlying a base substrate structure such as a thin film. Thus, substrate is not limited to any particular base structure, underlying dielectric layer or overlying dielectric layer, patterned or un-patterned, but rather, is contemplated to include any such dielectric layer or base structure, and any combination of dielectric layers and/or base structures. The description may reference particular types of substrates, but this is for illustrative purposes only.

Those skilled in the art will also understand that there can be many variations made to the operations of the techniques explained above while still achieving the same objectives of the present disclosure. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A metrology system for measuring wafer bow of a wafer, the metrology system comprising:

a wafer support configured to position a wafer for wafer bow measurement;

a first light source configured to illuminate a first side of the wafer during the wafer bow measurement;

a first pinhole mask disposed between the first light source and the wafer support, the first pinhole mask including a plurality of first pinholes that are arranged to pass first light from the first light source and project onto the first side of the wafer a plurality of first dots that correspond to the first pinholes in the first pinhole mask; and a first camera arranged to capture an image of the first dots from the first side of the wafer during the wafer bow measurement, wherein the first pinhole mask has a larger area than the wafer, or the first light source covers the whole first pinhole mask.

2. The metrology system of claim 1, wherein the first pinhole mask has a larger area than the wafer.

3. The metrology system of claim 1, further comprising:

a measurement control system coupled to the first light source and the first camera, the measurement control system configured to measure wafer bow of a target wafer by comparing an image of target dots captured for the target wafer with an image of reference dots captured for a reference wafer.

4. The metrology system of claim 3, wherein the first pinholes in the first pinhole mask are arranged according to a rectilinear pattern.

5. The metrology system of claim 4, wherein the first pinholes are spaced equally in a first direction of the rectilinear pattern and spaced equally in a second direction of the rectilinear pattern, the second direction orthogonal to the first direction.

6. The metrology system of claim 1, wherein the first light source covers the whole first pinhole mask.

7. The metrology system of claim 6, wherein a first opening is centrally located relative to the wafer and the first dots in the first pinhole mask.

8. The metrology system of claim 1, wherein the wafer support orients the wafer in a horizontal position relative to a direction of gravity.

9. The metrology system of claim 1, wherein the wafer support orients the wafer in a vertical position relative to a direction of gravity.

10. The metrology system of claim 9, wherein the wafer is oriented at an oblique inclination relative to vertical.

11. The metrology system of claim 10, wherein the oblique inclination is within 15 degrees off vertical orientation.

12. The metrology system of claim 1, further comprising:

a second light source configured to illuminate a second side of the wafer during the wafer bow measurement, the second side opposite the first side of the wafer;

a second pinhole mask disposed between the second light source and the wafer support, the second pinhole mask including a plurality of second pinholes that are arranged to pass second light from the second light source and project onto the second side of the wafer a plurality of second dots that correspond to the second pinholes in the second pinhole mask; and a second camera configured to capture an image of the second dots from the second side of the wafer during the wafer bow measurement.

13. The metrology system of claim 1, further comprising:

a wafer flipper configured to receive the wafer from the wafer support, flip the wafer, and return the wafer to the wafer support for the wafer bow measurement on a second side of the wafer, the second side opposite the first side of the wafer.

14. The metrology system of claim 1, wherein the wafer support is configured to flip the wafer and reposition the wafer for the wafer bow measurement on a second side of the wafer, the second side opposite the first side of the wafer.

15. The metrology system of claim 1, which is configured to perform the wafer bow measurement in less than 10 seconds.

16. The metrology system of claim 15, which is configured to compute the wafer bow of the wafer from the image of the first dots captured by the first camera in less than 30 seconds.

17. The metrology system of claim 1, wherein the wafer support supports the wafer at a center of the wafer.

18. The metrology system of claim 1, wherein the wafer support supports the wafer at an edge of the wafer.

19. The metrology system of claim 1, wherein the first light source is further configured to illuminate a second side of the wafer during the wafer bow measurement, the second side opposite the first side of the wafer, the first pinholes of the first pinhole mask are further arranged to pass second light from the first light source and project onto the second side of the wafer a plurality of second dots that corresponds to the first pinholes, the first camera is further arranged to capture an image of the second dots from the second side of the wafer, and the wafer bow measurement is performed on the first side and the second side of the wafer to correct for effects of gravity.

20. The metrology system of claim 1, further comprising:

an alignment system configured to align the wafer on the wafer support for the wafer bow measurement.

* * * * *